US006800985B2

United States Patent
Baker et al.

(10) Patent No.: US 6,800,985 B2
(45) Date of Patent: Oct. 5, 2004

(54) MOUNTING AND HEATSINK METHOD FOR PIEZOELECTRIC TRANSFORMER

(76) Inventors: Eric M. Baker, 900 Glade Rd., Apt. 1, Blacksburg, VA (US) 24060; Weixing Huang, 1210 University City Blvd., Apt. J-114, Blacksburg, VA (US) 24060; Dan Y. Chen, 2013 Carroll Dr., Blacksburg, VA (US) 24060; Fred C. Lee, 2969 Stratford La., Blacksburg, VA (US) 24060

( * ) Notice: Subject to any disclaimer, the term of this patent is extended or adjusted under 35 U.S.C. 154(b) by 0 days.

(21) Appl. No.: 10/132,329

(22) Filed: Apr. 22, 2002

(65) Prior Publication Data

US 2003/0020372 A1 Jan. 30, 2003

Related U.S. Application Data

(60) Provisional application No. 60/284,930, filed on Apr. 20, 2001.

(51) Int. Cl.[7] ............................................. H01L 41/053
(52) U.S. Cl. ....................................................... 310/348
(58) Field of Search .................................. 310/341, 348, 310/359

(56) References Cited

U.S. PATENT DOCUMENTS 6,144,142 A * 11/2000 Face et al. ................... 310/358
2002/0180314 A1 * 12/2002 Pohl ............................ 310/348

FOREIGN PATENT DOCUMENTS

JP          8-51242      * 2/1996     ........... H01L/41/08

* cited by examiner

Primary Examiner—Thomas M. Dougherty
(74) Attorney, Agent, or Firm—David J. Bolduc

(57) ABSTRACT

The present invention relates to a process for mounting and heatsinking a piezoelectric transformer (PT). The method provides a method to mount a PT, while allowing heat generated in the device to be conducted away to the mounting surface. The method can be used in piezoelectric transformer based ballasts and power supplies such that high power levels may be achieved due to minimizing thermal constraints on the devices.

4 Claims, 3 Drawing Sheets

MOUNTING AND HEATSINK METHOD FOR PIEZOELECTRIC TRANSFORMER

This application claims benefit of Provisional application Ser. No. 60/284,930, filed Apr. 20, 2001.

BACKGROUND OF THE INVENTION

1. Field of the Invention

The present invention relates to a process for mounting and heatsinking a piezoelectric transformer (PT). The method not only allows for a simple method to mount a PT, but also allows heat generated in the device to be conducted away to the mounting surface. The method can be used be manufacturers of piezoelectric transformer based ballasts and power supplies such that higher power levels may be achieved than previously possible due to thermal constraints on the devices.

2. Description of the Prior Art

The invention described herein is motivated by the difficulty in mounting a piezoelectric transformer (PT) to a printed circuit board or other devices. The piezoelectric transformer is a device which converts electrical energy into mechanical energy in the actuator layer(s) and converts mechanical energy back to electrical energy in the transducer layer(s). A diagram of a simple radial mode piezoelectric transformer is shown in FIG. 1.

Because the piezoelectric transformer vibrates, any means by which it is adhered to a surface causes loss of energy through the fixing media to the mounting surface. Presently the mounting of piezoelectric transformers is very difficult in that the vibration cannot be suppressed. The coupling of the mechanical energy to any mounting surface causes attenuation and loss of energy through the coupling media to the mounting surface. The result is a loss of apparent efficiency due to power that is consumed through the interface.

Thus, a problem with conventional PT mounting methods is the difficulty in mounting the piezoelectric transformer to a printed circuit board or other devices.

Another problem with conventional PT mounting methods is that because the piezoelectric transformer vibrates, any means by which it is adhered to a surface causes loss of energy through the fixing media to the mounting surface.

Another problem with conventional PT mounting methods is that the vibration cannot be suppressed.

Another problem with conventional PT mounting methods is that the coupling of the mechanical energy to a mounting surface causes attenuation.

Another problem with conventional PT mounting methods is that the coupling of the mechanical energy to a mounting surface causes loss of energy through the coupling media to the mounting surface.

Another problem with conventional PT mounting methods is that the coupling of the mechanical energy to a mounting surface results in a loss of apparent efficiency due to power that is consumed through the interface.

Accordingly, it would be desirable to provide PT mounting methods that overcome the aforementioned problems of the prior art.

SUMMARY OF THE INVENTION

The present invention provides a process and device for mounting and heatsinking a piezoelectric transformer (PT). The method not only allows for a simple method to mount a PT, but also allows heat generated in the device to be conducted away to the mounting surface. The method can be used be manufacturers of piezoelectric transformer based ballasts and power supplies such that higher power levels may be achieved than previously possible due to thermal constraints on the devices.

The invention described herein is motivated by the difficulty in mounting a piezoelectric transformer (PT) to a printed circuit board or other devices. The piezoelectric transformer is a device which converts electrical energy into mechanical energy in the actuator layer(s) and converts mechanical energy back to electrical energy in the transducer layer(s). A diagram of a simple radial mode piezoelectric transformer is shown in FIG. 1.

Because the piezoelectric transformer vibrates, any means by which it is adhered to a surface causes loss of energy through the fixing media to the mounting surface. Presently the mounting of piezoelectric transformers is very difficult in that the vibration cannot be suppressed. The coupling of the mechanical energy to any mounting surface causes attenuation and loss of energy through the coupling media to the mounting surface. The result is a loss of apparent efficiency due to power that is consumed through the interface.

By carefully choosing an interface material to use in the mounting process, two features can be achieved. The first benefit allows virtually no conduction of mechanical energy to the mounting surface. The second benefit of the mounting method allows heat conduction from the device to the surface.

Referring to FIG. 2: FIG. 2 shows a diagram of the physical mounting method for a PT to a mounting surface. A multilayer disc-shaped radial mode piezoelectric transformer having electrodes on its opposing faces is sandwiched between to layers of interface material. A spring clip connects to the mounting surface over the sandwich structure and a metal disk. The spring clip and metallic disk are used to apply force to the metal disk atop the sandwich structure. The force is used to provide good thermal contact to both the upper and lower surface of the piezoelectric transformer. By connecting to the mounting surface, the spring clip provides both a mechanical mounting method and a means for thermal conduction.

Accordingly, it is a primary object of the present invention to provide a means of mounting a piezoelectric transformer to a mounting surface.

It is another object of the present invention to provide a device of the character described which minimizes or eliminates loss of energy through the fixing media to the mounting surface.

It is another object of the present invention to provide a device of the character described which minimizes or eliminates attenuation and loss of energy through the coupling media to the mounting surface.

It is another object of the present invention to provide a device of the character described which minimizes or eliminates the loss of apparent efficiency due to power that is consumed through the interface.

It is another object of the present invention to provide a device of the character described which allows virtually no conduction of mechanical energy to the mounting surface.

It is another object of the present invention to provide a device of the character described which allows heat conduction from the device to the surface.

Further objects and advantages of the invention will become apparent from a consideration of the drawings and ensuing description thereof.

BRIEF DESCRIPTION OF THE DRAWINGS

FIG. 2b is an assembled perspective view showing the details of construction of the mounting components and piezoelectric transformer of FIG. 2a;

FIG. 4 is graph of the internal resonance versus applied force for a variety of materials used as the interface material(s) in FIG. 2a;

DESCRIPTION OF THE PREFERRED EMBODIMENT

As will be further described, process and device is provided for mounting and heatsinking a piezoelectric transformer 1 (PT). The method not only allows for a simple method to mount a PT 1, but also allows heat generated in the device to be conducted away to the mounting surface 70. The method can be used be manufacturers of piezoelectric transformer based ballasts and power supplies such that higher power levels may be achieved than previously possible due to thermal constraints on the devices.

Figure 1:
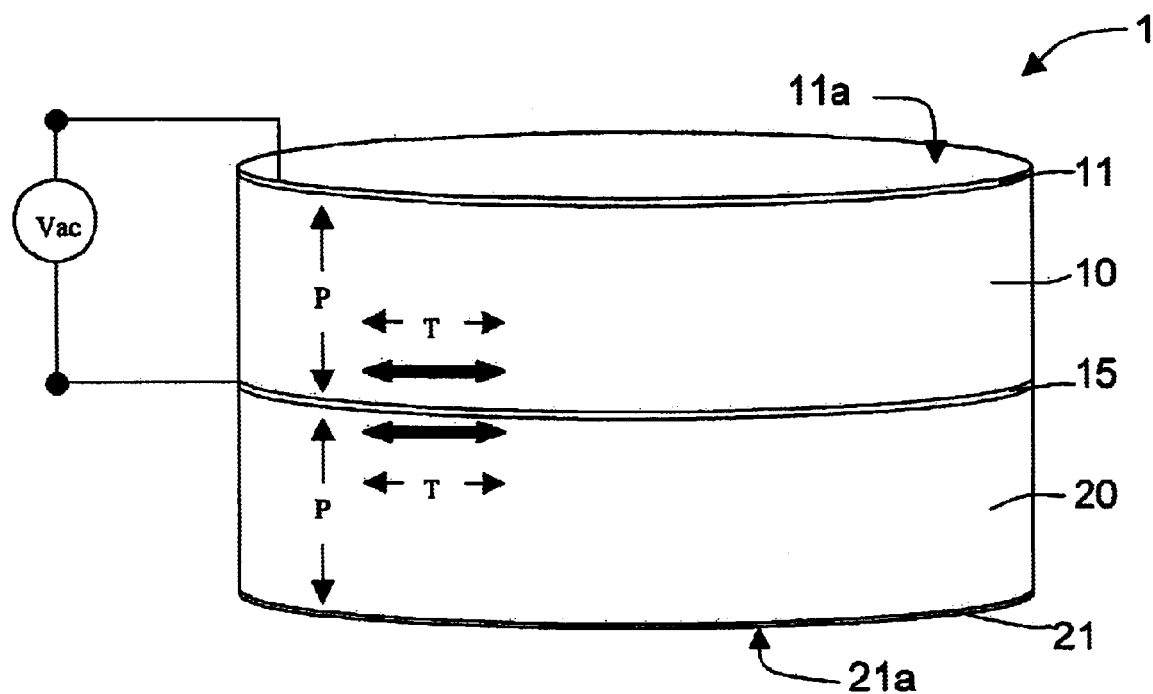
FIG. 1 is a perspective and partial schematic view of a radial mode piezoelectric transformer used in the present invention.

The invention described herein is motivated by the difficulty in mounting a piezoelectric transformer (PT) 1 to a printed circuit board 70 or other devices. The piezoelectric transformer 1 is a device which converts electrical energy into mechanical energy in the actuator layer(s) 10 and converts mechanical energy back to electrical energy in the transducer layer(s) 20. A diagram of a simple radial mode piezoelectric transformer 1 is shown in FIG. 1.

Because the piezoelectric transformer 1 vibrates, any means by which it is adhered to a surface causes loss of energy through the fixing media to the mounting surface 70. Presently the mounting of piezoelectric transformers 1 is very difficult in that the vibration cannot be suppressed. The coupling of the mechanical energy to any mounting surface 70 causes attenuation and loss of energy through the coupling media to the mounting surface 70. The result is a loss of apparent efficiency due to power that is consumed through the interface.

However, by carefully choosing an interface materials 30 and 40 to use in the mounting process, two features can be achieved. The first benefit allows virtually no conduction of mechanical energy to the mounting surface 70. The second benefit of the mounting method allows heat conduction from the device to the surface 70.

Figure 2A:
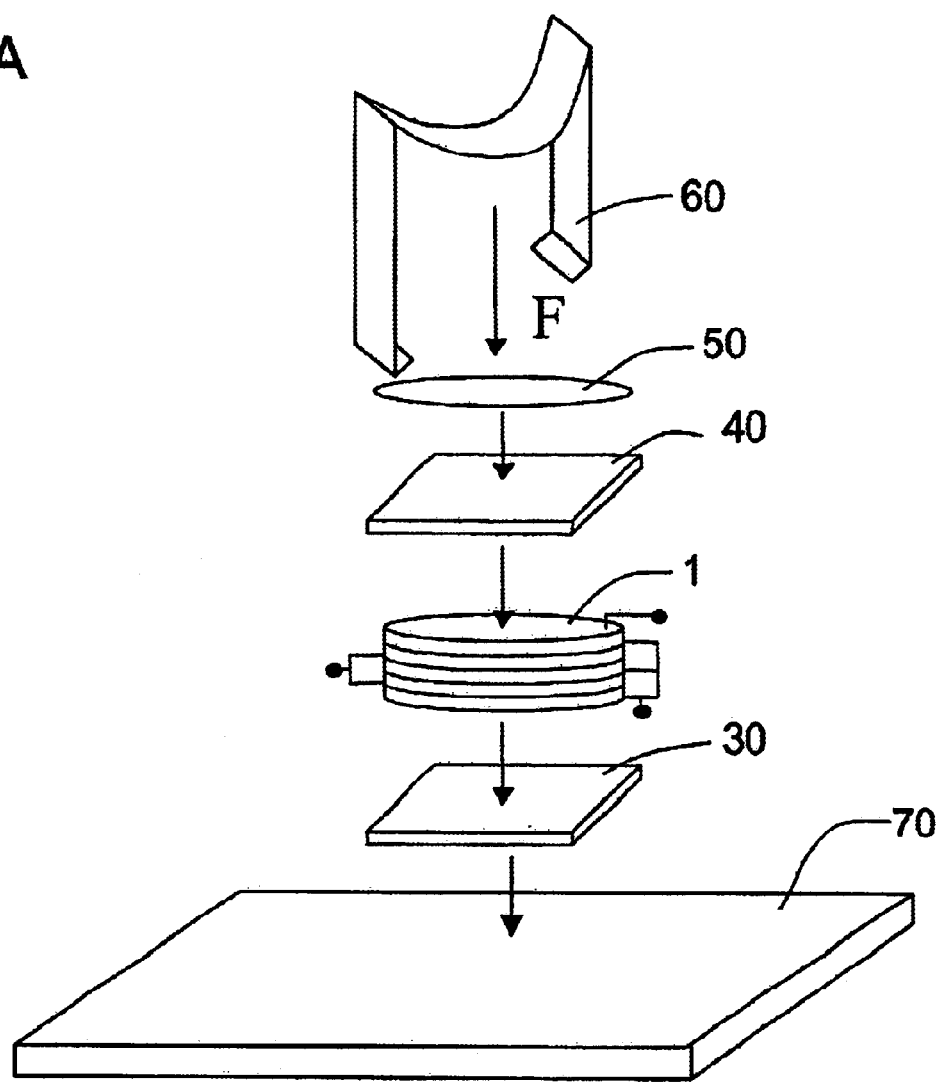
FIG. 2a is an expanded perspective view showing the details of construction of the mounting components for the piezoelectric transformer of FIG. 1.
Figure 2B:
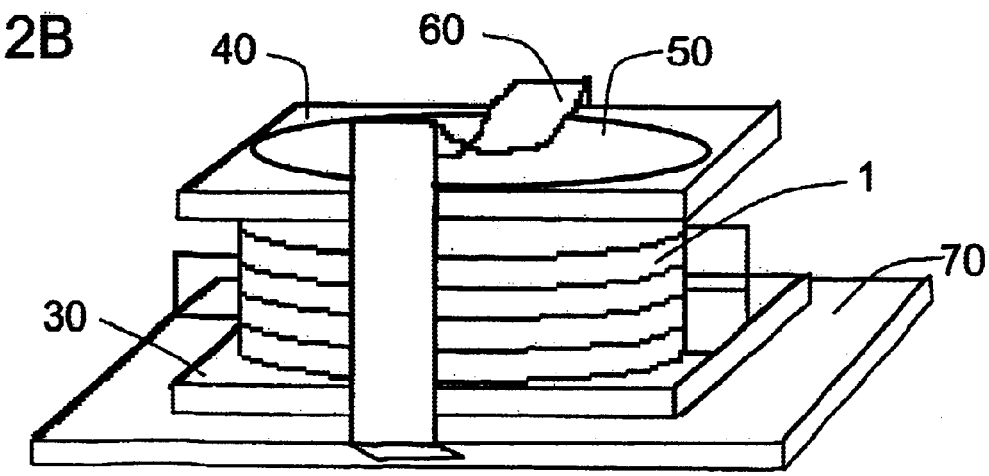

Referring to FIG. 2: FIG. 2 shows a diagram of the physical mounting method for a PT 1 to a mounting surface 70. A multilayer disc-shaped radial mode piezoelectric transformer 1 having electrodes (preferably copper) 11 and 21 on its opposing faces 11a and 21a is sandwiched between two layers of interface material 30 and 40. A spring clip 60 connects to the mounting surface 70 over the sandwich structure (40, 1 and 30) and a metal disk 50. The spring clip 60 and metallic disk 50 are used to apply force to the metal disk 50 atop the sandwich structure (40, 1 and 30). The force is used to provide good thermal contact to both the upper and lower surface 11a and 21a of the piezoelectric transformer 1. By connecting to the mounting surface 70, the spring clip 60 provides both a mechanical mounting method and a means for thermal conduction.

Figure 4:
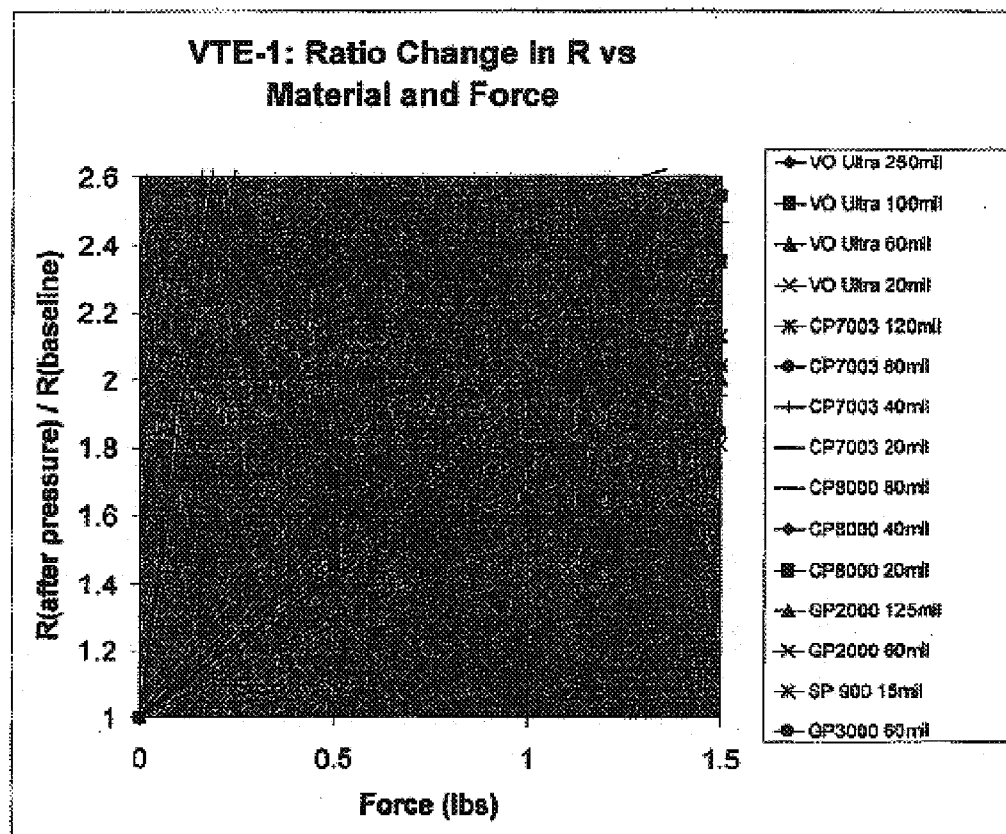

Referring to FIG. 4: Materials tested as interface layers 30 and 40 were 20 mil, 80 mil, 100 mil and 250 mil thicknesses of GAP PAD™ VO Ultra Soft thermally conductive interface material, manufactured by The Bergquist Company of Chanhassen, Minn. GAP PAD™ VO Ultra Soft thermally conductive interface materials comprise a thermally conductive polymer on a rubber coated fiberglass carrier. Other materials included were 60 mil and 125 mil thicknesses of GP2000 (GAP PAD™ 2000), 60 mil of GP3000 (GAP PAD™ 3000), and 15 mil of SP800 or SP900S (SIL-PAD™ 800 or 900-S) thermally conductive interface materials, manufactured by The Bergquist Company of Chanhassen, Minn. SIL-PAD™ thermally conductive interface materials are of a silicone and fiberglass construction. Other interface materials 30 and 40 included were 20 mil, 40 mil, 80 mil and 120 mil thicknesses of POLARCHIP CP7003, and 20 mil, 40 mil and 80 mil thicknesses of POLARCHIP CP8000 Thermal Interface Materials as manufactured by w. L. Gore & Associates, Inc. of Newark, Del. CP7003 and CP8000 Thermal Interface Materials are fluoropolymer composites that consist of an expanded polytetraflouroethylene (ePTFE) matrix filled with boron nitride (BN) particles.

Figure 3:
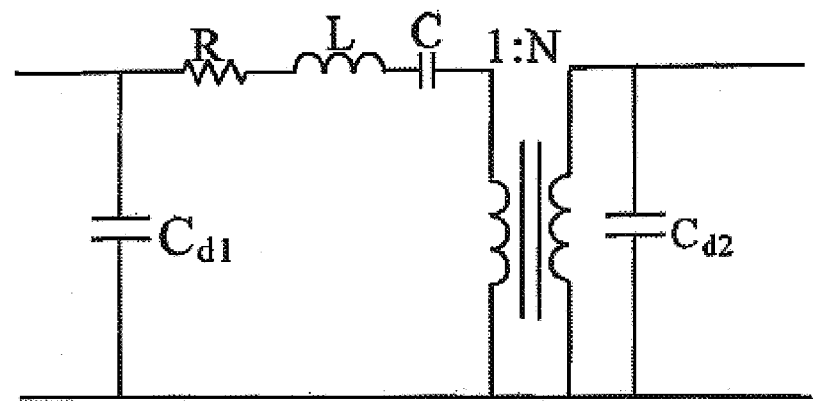
FIG. 3 is schematic showing the simplified piezoelectric transformer equivalent circuit model.

The accepted simplified equivalent circuit model for a piezoelectric transformer is shown in FIG. 3. The internal resistance R, represents the potential losses of the piezoelectric transformer 1 via electrical power loss during current conduction. Through experimentation it was determined that the internal resistance R dramatically increases when the interface material 30 or 40 is not chosen correctly. Shown in FIG. 4, is an example of the results of testing several different thermal interface materials 30 and 40 with various spring forces.

The y-axis of the chart shows the change in the internal resistance when compared to the same piezoelectric transformer 1 in the unmounted state. The x-axis shows the equivalent applied spring force. Materials 30 and 40 which show the lowest percentage increase in internal resistance have the least effect on the electrical performance of the PT 1.

Referring again to FIG. 4: Notice the slope of the curves, based on some materials 30 and 40, are much greater than others. Through experimentation it was discovered that the nature of the interface between the piezoelectric transformer 1 and the thermally conductive material 30 and 40 must be such that there is a non-adhesive quality to the interface material 30 and 40. Even a slight "tackiness" to the material causes a great increase in losses.

In order to provide a reference for the usefulness of the invention, a 32-watt ballast circuit was constructed using a radial mode piezoelectric transformer 1 from Face Electronics, LC of Norfolk, Va. The piezoelectric transformer 1 was mounted as shown in FIG. 2 directly to a dual sided copper printed circuit board 70. At a continuous output of 32 watts the temperature reached a steady state level of 48° C. above ambient with no forced air cooling. Testing showed the steady state temperature was reached after approximately 10 minutes. In contrast, the same test was performed with the piezoelectric transformer 1 unmounted on the same printed circuit board 70. Within 3 minutes the temperature soared above 100° C. at which time the test was aborted to avoid damage to the device.

While the above description contains many specificities, these should not be construed as limitations on the scope of the invention, but rather as an exemplification of one preferred embodiment thereof. Many other variations are possible, for example:

The piezoelectric transformer may have as few as one input layer and one output layer or may have multiple layers for the input or the output.

The piezoelectric transformer may comprise a radial, thickness or longitudinal mode transformer.

The spring clip may be chosen from a variety of available designs.

The thermal interface layers may be chosen from a variety of appropriate materials.

The disk need not be metallic but may comprise other durable and/or thermally conductive materials.

Accordingly, the scope of the invention should be determined not by the embodiment illustrated, but by the appended claims and their legal equivalents.

We claim:

1. A method of heatsinking and mounting a piezoelectric transformer to a mounting surface comprising the steps of:

selecting a radial mode piezoelectric transformer having at least one output layer and at least one input layer and having first and second electrodes on outward facing major faces said at least one input layer and at least one output layer;

selecting a mounting surface for mounting of said radial mode piezoelectric transformer;

selecting first and second thermally conductive interface layers;

placing said first thermally conductive interface layer in contact with said first electrode;

placing said second thermally conductive interface layer in contact with said second electrode and said mounting surface;

placing a metallic disk in contact with said first thermally conductive interface layer; and applying a force to said metallic disk, said first thermally conductive interface layer, said radial mode piezoelectric transformer, and said second thermally conductive interface layer by connecting a spring clip to said mounting surface such that said spring clip is in compressive contact with said metallic disk.

2. The method of claim 1, wherein said step of selecting first and second thermally conductive interface layers comprises:

selecting first and second non-adhesive thermally conductive interface layers that do not adhere to said first or second electrodes.

3. The method of claim 2, wherein said step of selecting first and second non-adhesive thermally conductive interface layers comprises selecting a material from the group comprising:

silicone, fiberglass, rubber, thermally conductive polymers, and fluoropolymer composites, and combinations thereof.

4. The method of claim 2, wherein said step of selecting first and second non-adhesive thermally conductive interface layers comprises selecting a fluoropolymer composite consisting of an expanded polytetraflouroethylene (ePTFE) matrix filled with boron nitride (BN) particles.

* * * * *